(12) United States Patent
Lin et al.

(10) Patent No.: US 10,700,020 B2
(45) Date of Patent: Jun. 30, 2020

(54) THIN FILM TRANSISTOR SUBSTRATE AND DISPLAY DEVICE

(71) Applicant: HANNSTAR DISPLAY CORPORATION, Taipei (TW)

(72) Inventors: Sung-Chun Lin, Tainan (TW); Hsien-Tang Hu, Taichung (TW); Hsuan-Chen Liu, Kaohsiung (TW); Chien-Ting Chan, Tainan (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 315 days.

(21) Appl. No.: 15/904,413

(22) Filed: Feb. 25, 2018

(65) Prior Publication Data

US 2019/0067218 A1 Feb. 28, 2019

(30) Foreign Application Priority Data

Aug. 30, 2017 (CN) .......................... 2017 1 0766459

(51) Int. Cl.
*H01L 23/60* (2006.01)
*H02H 9/04* (2006.01)
(Continued)

(52) U.S. Cl.
CPC ........ *H01L 23/60* (2013.01); *G02F 1/136204* (2013.01); *H01L 27/0292* (2013.01); *H01L 27/0296* (2013.01); *H01L 27/124* (2013.01); *H01L 27/1248* (2013.01); *H02H 7/20* (2013.01); *H02H 9/041* (2013.01)

(58) Field of Classification Search
CPC . H01L 23/60; H01L 27/0292; H01L 27/0296; G02F 1/136204
See application file for complete search history.

(56) References Cited

U.S. PATENT DOCUMENTS 9,196,804 B2 11/2015 Cho
2010/0073587 A1* 3/2010 Satoh .................. G02F 1/13452
349/40
(Continued)

FOREIGN PATENT DOCUMENTS

CN 102193671 A 9/2011
CN 106478730 A 3/2017
(Continued)

*Primary Examiner* — Scott Bauer
(74) *Attorney, Agent, or Firm* — Winston Hsu

(57) ABSTRACT

A thin film transistor substrate having a display region and a peripheral region, and the thin film transistor substrate includes a first substrate, scan lines, data lines, an insulating layer, first thin film transistors, at least one passivation layer and at least one gate driving circuit. The first substrate has an electrostatic protection area and a driving circuit area, and the electrostatic protection area and the driving circuit area are situated in the peripheral region. The scan lines, the data lines and the first thin film transistors are disposed in the display region. The insulating layer includes a gate insulator of the first thin film transistor, and the passivation layer is disposed on the insulating layer. The gate driving circuit is disposed in the driving circuit area. At least one of the passivation layer and the insulating layer are not disposed in the electrostatic protection area.

20 Claims, 10 Drawing Sheets

(51) Int. Cl.
*H01L 27/12* (2006.01)
*H02H 7/20* (2006.01)
*H01L 27/02* (2006.01)
*G02F 1/1362* (2006.01)

(56) References Cited

U.S. PATENT DOCUMENTS

| | | | | |
|---|---|---|---|---|
| 2010/0134740 | A1* | 6/2010 | Nakao | G02F 1/136204 349/138 |
| 2013/0106811 | A1* | 5/2013 | Hirabayashi | G02F 1/136204 345/204 |
| 2015/0062511 | A1* | 3/2015 | Shin | G02F 1/1333 349/122 |
| 2016/0093685 | A1* | 3/2016 | Kwon | H10L 51/5237 257/40 |
| 2016/0155408 | A1* | 6/2016 | Lee | G02F 1/136204 345/211 |

FOREIGN PATENT DOCUMENTS

| | | |
|---|---|---|
| CN | 106887525 A | 6/2017 |
| CN | 106933398 A | 7/2017 |

* cited by examiner

THIN FILM TRANSISTOR SUBSTRATE AND DISPLAY DEVICE

BACKGROUND OF THE INVENTION

1. Field of the Invention

The present invention relates to a thin film transistor substrate and a display device, and more particularly to a thin film transistor substrate and a display device that can mitigate the damaging effects of electrostatic discharge and decrease water vapor invasion.

2. Description of the Prior Art

A conventional display device is composed of two substrates and layers with various electronic components disposed between the substrates to display images. Since such a display device has the characteristics of thin appearance, low power consumption and no radiation pollution, it has been widely used in many kinds of portable or wearable electronic products, such as notebooks, smart phones, watches, and display devices in cars, for transmitting and displaying information more conveniently.

The display device inevitably stores electrostatic charges in its interior, and therefore electrostatic discharge easily occurs. In some situations, electrostatic discharge occurs when the display device is in contact with an external object (such as a finger) that itself has electrostatic charge. Since this phenomenon is usually accompanied by a large amount of electrostatic charge, the static-sensitive components of the display device will be influenced or damaged. For example, the electrostatic discharge makes a threshold voltage of a thin film transistor (TFT) shift, thereby affecting the switch effect, or damages a conductive line or a contact hole. Therefore, improving the electrostatic discharge protection effect or restraining the occurrence of electrostatic discharge in the display device needs to be developed and improved.

SUMMARY OF THE INVENTION

The technical problem to be solved by the present invention is to decrease the effect of electrostatic discharge in order to influence electronic components of a display device. The present invention provides a thin film transistor substrate and a display device having an electrostatic protection area for mitigating the damaging influence caused by electrostatic discharge to protect electronic components, and to further improve the structural stability and decrease water vapor invasion.

In order to solve the above problems, the present invention provides a thin film transistor substrate having a display region and a peripheral region. The thin film transistor substrate includes a first substrate, a plurality of scan lines, a plurality of data lines, an insulating layer, a plurality of first thin film transistors, at least one passivation layer and at least one gate driving circuit. The first substrate has at least one electrostatic protection area and at least one driving circuit area, wherein the electrostatic protection area and the driving circuit area are disposed in the peripheral region, and the driving circuit area is disposed between the electrostatic protection area and the display region. The scan lines and the data lines are disposed on the first substrate and situated in the display region. The first thin film transistors are disposed on the first substrate and situated in the display region, and each first thin film transistor includes a gate, a drain, a source, a gate insulator and a semiconductor channel. The gate insulator is disposed between the gate and the semiconductor channel, and the gate and the source are respectively electrically connected to a corresponding scan line of the scan lines and a corresponding data line of the data lines. The insulating layer includes the gate insulators of the first thin film transistors. The at least one passivation layer is disposed on the insulating layer. The gate driving circuit is disposed in the driving circuit area of the first substrate, and the gate driving circuit is electrically connected to the scan lines. At least one of the at least one passivation layer and the insulating layer is not disposed in the electrostatic protection area.

The present invention further provides a display device including a thin film transistor substrate, a second substrate and a sealant. The thin film transistor substrate has a display region and a peripheral region. The thin film transistor substrate includes a first substrate, a plurality of scan lines, a plurality of data lines, an insulating layer, a plurality of first thin film transistors, at least one passivation layer and at least one gate driving circuit. The first substrate has at least one electrostatic protection area and at least one driving circuit area, wherein the electrostatic protection area and the driving circuit area are disposed in the peripheral region, and the driving circuit area is disposed between the electrostatic protection area and the display region. The scan lines and the data lines are disposed on the first substrate and situated in the display region. The first thin film transistors are disposed on the first substrate and situated in the display region, and each first thin film transistor includes a gate, a drain, a source, a gate insulator and a semiconductor channel. The gate insulator is disposed between the gate and the semiconductor channel, and the gate and the source are respectively electrically connected to a corresponding scan line of the scan lines and a corresponding data line of the data lines. The insulating layer includes the gate insulators of the first thin film transistors. The at least one passivation layer is disposed on the insulating layer. The gate driving circuit is disposed in the driving circuit area of the first substrate, and the gate driving circuit is electrically connected to the scan lines. At least one of the at least one passivation layer and the insulating layer is not disposed in the electrostatic protection area. The second substrate is disposed opposite to the thin film transistor substrate. The sealant is disposed between the thin film transistor substrate and the second substrate, and the sealant overlaps at least a portion of the electrostatic protection area in a direction perpendicular to the first substrate.

In the film structure in the electrostatic protection area of the display device of the present invention, since the sealant replaces the insulating material with a high dielectric constant (high-K material) included in the electronic components in the display region or the peripheral region, the dielectric constant of the surrounding of the display device is decreased to reduce the storage of electrostatic charges, so as to restrain the occurrence of electrostatic discharge or decrease the damaging influence damage to the display device caused by electrostatic discharge. Furthermore, because the electrostatic protection area is disposed at the edge of the first substrate and situated at the side of the driving circuit area adjacent to the edge of the first substrate, the electrostatic protection area not only can decrease the storage of electrostatic charges entering from the edges of the display device, but can also decrease the influence caused by the electrostatic charges on the gate driving circuit of the driving circuit area adjacent to the electrostatic protection area to protect the gate driving circuit. Therefore, the reliability of the display device with narrow border is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
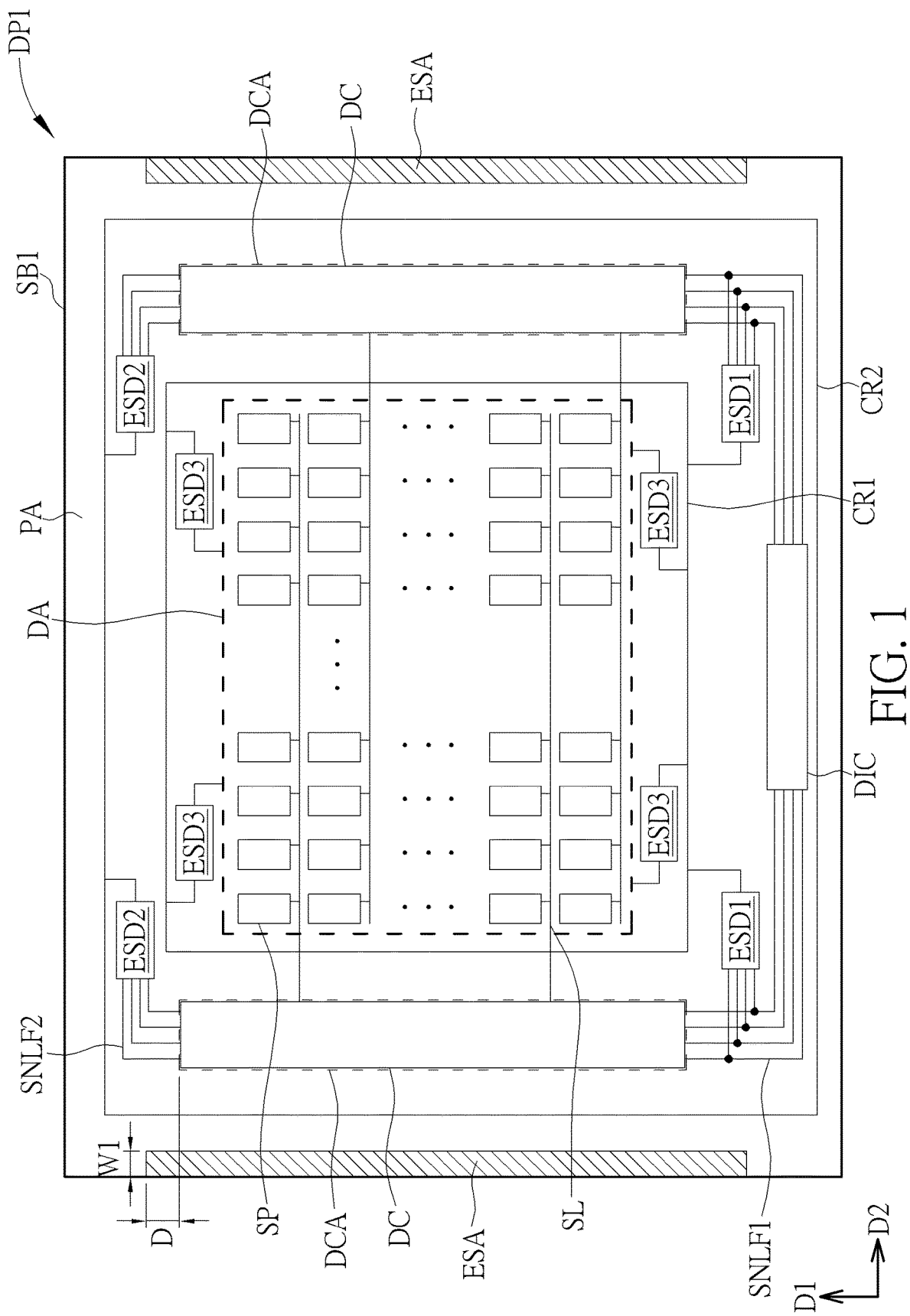
FIG. 1 and FIG. 2 are schematic diagrams showing a top view of a display device of a first embodiment of the present invention.

To provide a better understanding of the present invention to those skilled in the technology, preferred embodiments will be detailed as follows. The preferred embodiments of the present invention are illustrated in the accompanying drawings with numbered elements to elaborate on the contents and effects to be achieved. It should be noted that the drawings are simplified schematics, and therefore show only the components and combinations associated with the present invention, so as to provide a clearer description of the basic architecture or method of implementation. The components would be complex in reality. In addition, for ease of explanation, the components shown in the drawings may not represent their actual number, shape, and dimensions; details can be adjusted according to design requirements.

Figure 2:
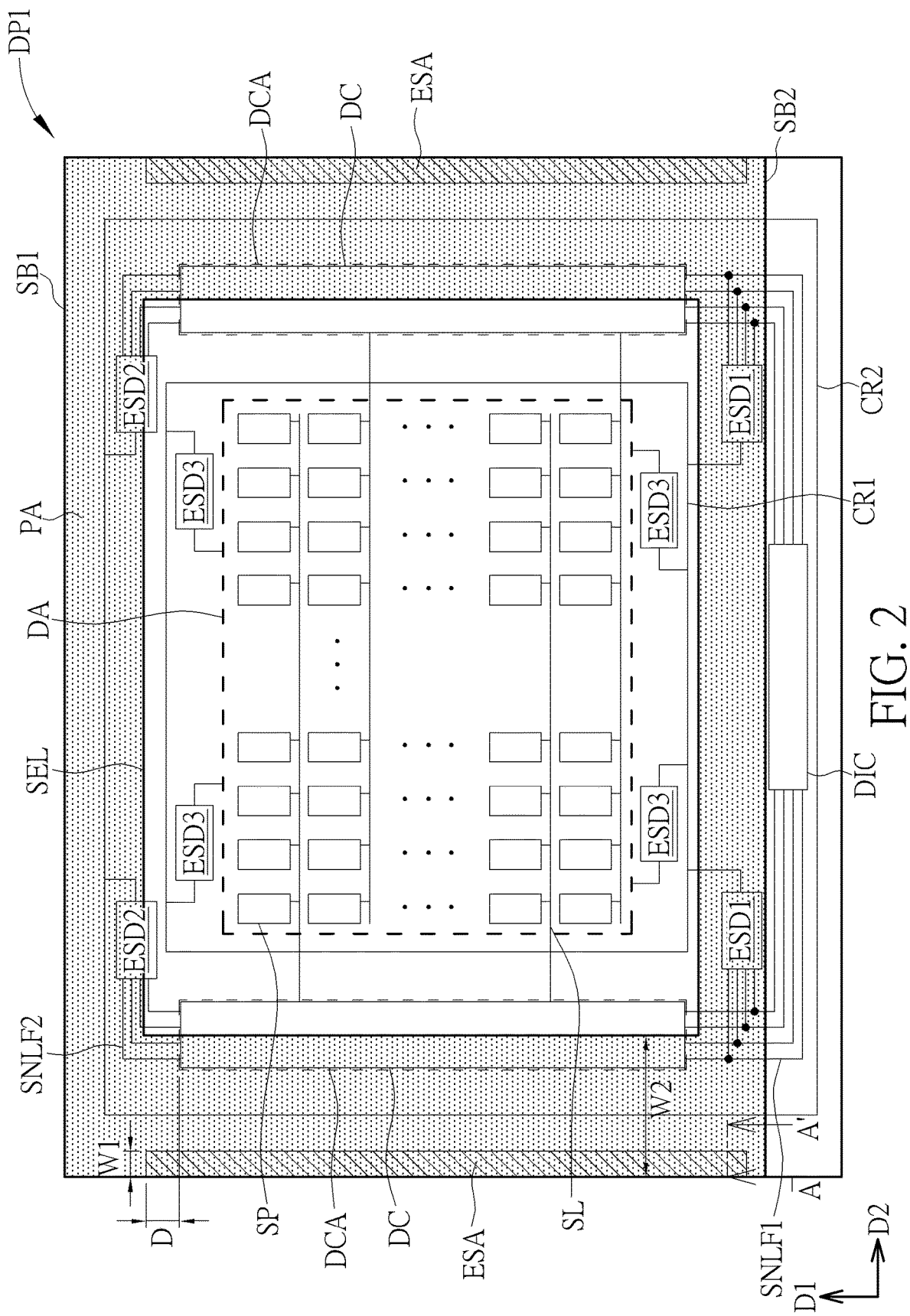

FIG. 1 and FIG. 2 are schematic diagrams showing a top view of a display device of a first embodiment of the present invention, wherein FIG. 1 shows a thin film transistor substrate that includes a first substrate and components disposed on the first substrate, and FIG. 2 further shows a second substrate and the disposition of a sealant. The display device DP1 of the present invention may be a liquid crystal display device, but the present invention is not limited thereto. The display device DP1 may be other types of flat display devices, such as an electrophoretic display device, an organic light-emitting diode display device or a micro light-emitting diode display device. As shown in FIG. 1 and FIG. 2, the display device DP1 and the thin film transistor substrate of the first embodiment of the present invention have a display region DA and a peripheral region PA. The display region DA is utilized for displaying images and includes a plurality of sub pixels SP. The peripheral region PA is situated at one or at least one outer side of the display region DA. In this embodiment, the peripheral region PA surrounds the display region DA, but the present invention is not limited thereto. In addition, in this embodiment, a width of the peripheral region PA may be smaller than or equal to 1 mm, such that a narrow border arrangement will be achieved, but the present invention is not limited thereto. The display device DP1 of the first embodiment of the present invention includes a first substrate SB1, a second substrate SB2, a plurality of scan lines SL, a plurality of data lines (not shown in figure), a plurality of sub pixels SP, at least one gate driving circuit DC and a sealant SEL, wherein the second substrate SB2 and the sealant SEL are not shown in FIG. 1, and FIG. 2 further shows the second substrate SB2 and the sealant SEL. The first substrate SB1 and the second substrate SB2 are disposed opposite to each other. The first substrate SB1 and the second substrate SB2 may respectively be a rigid substrate such as a glass substrate, a plastic substrate, a quartz substrate or a sapphire substrate, or a flexible substrate including polyimide (PI) or polyethylene terephthalate (PET) for example, but the present invention is not limited thereto. Moreover, the second substrate SB2 covers at least the display region DA, and thus, in this embodiment, a size of the second substrate SB2 may be greater than a size of the display region DA and smaller than a size of the first substrate SB1 (as shown in FIG. 2), but the present invention is not limited thereto.

Figure 3:
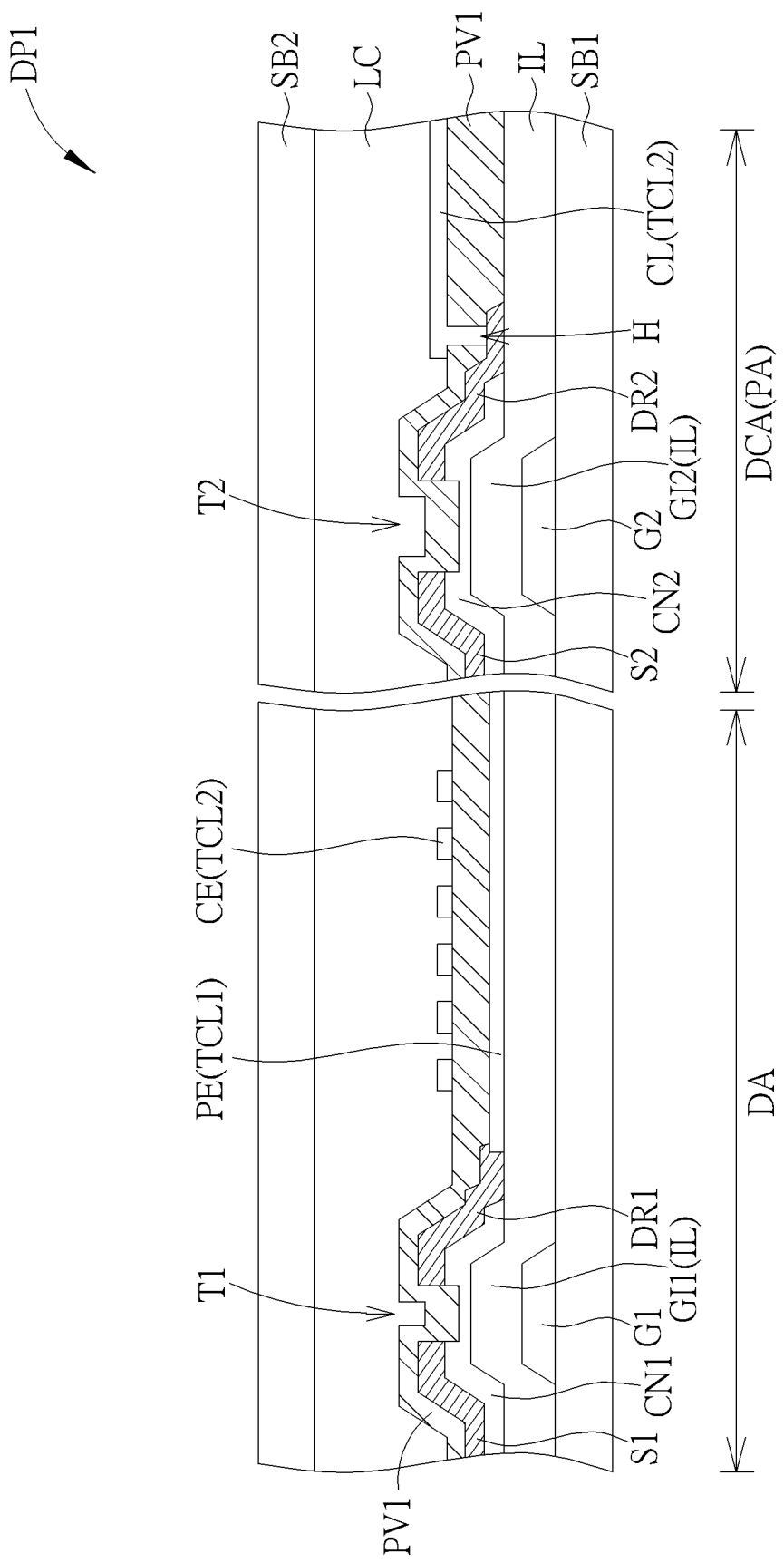
FIG. 3 is a schematic diagram showing a cross-section of a portion of a sub pixel and a portion of the gate driving circuit of the display device of the first embodiment of the present invention.

Referring to FIG. 3 with FIG. 1, FIG. 3 is a schematic diagram showing a cross-section of a portion of a sub pixel and a portion of the gate driving circuit of the display device of the first embodiment of the present invention, wherein a cross-sectional view of a thin film transistor of the gate driving circuit DC is shown on the right hand side and a cross-sectional view of the portion of the sub pixel is shown on the left hand side of FIG. 3. Note that FIG. 3 does not illustrate a bottom alignment layer, a color filter layer, a light shielding layer, an over-coating layer and a top alignment layer, wherein the bottom alignment layer is disposed between the first substrate SB1 and a liquid crystal layer LC, the color filter layer, the light shielding layer, the over-coating layer and the top alignment layer are disposed between the second substrate SB2 and the liquid crystal layer LC. As shown in FIG. 3 (on the left hand side), one of the sub pixels SP may include a first thin film transistor T1, a pixel electrode PE and a common electrode CE utilized for controlling liquid crystal molecules of the liquid crystal layer LC, so as to display a gray level of the image. In detail, in this embodiment, the display device DP1 may include a plurality of first thin film transistors T1, a first transparent conductive layer TCL1, a first passivation layer PV1, a second transparent conductive layer TCL2 and the liquid crystal layer LC. The first thin film transistors T1 are disposed on the first substrate SB1 and situated in the display region DA, and each first thin film transistor T1 includes a gate G1, a gate insulator GI1, a drain DR1, a source S1 and a semiconductor channel CN1. In this embodiment, the first thin film transistor T1 may be a bottom-gate thin film transistor, but the present invention is not limited thereto. In other embodiments, the first thin film transistor T1 may be a top-gate thin film transistor. Furthermore, the first thin film transistor T1 maybe a low temperature poly-silicon (LTPS) thin film transistor, a indium gallium zinc oxide (IGZO) thin film transistor or an amorphous silicon (a-Si) thin film transistor, but the present invention is not limited thereto. The gate insulators GI1 of the first thin film transistors T1 in the display region DA are formed of an insulating layer IL. In other words, the insulating layer IL includes the gate insulators GI1 of the first thin film transistors T1 in the display region DA. The first transparent conductive layer TCL1 is disposed on the insulating layer IL. In this embodiment, the first transparent conductive layer TCL1 includes a plurality of the pixel electrodes PE, but the present invention is not limited thereto. The first passivation layer PV1 is disposed on the first transparent conductive layer TCL1 and the first thin film transistors T1, so as to make the pixel electrodes PE be electrically insulated to the common electrode CE. The second transparent conductive layer TCL2 is disposed on the first passivation layer PV1. In this embodiment, the second transparent conductive layer TCL2 includes at least one common electrode CE, but the present invention is not limited thereto. Moreover, a material of the first transparent conductive layer TCL1 and a material of the second transparent conductive layer TCL2 may include indium tin oxide (ITO) or indium zinc oxide (IZO), and a material of the first passivation layer PV1 may include silicon oxide, silicon nitride or silicon oxynitride, but the present invention is not limited thereto. The insulating layer IL and the first passivation layer PV1 maybe a single layer structure or a multi-layer structure. The liquid crystal layer LC is disposed between the second transparent conductive layer TCL2 and the second substrate SB2, so as to affect a transmittance and the gray level of the display region DA of the display device DP1. In each of the sub pixels SP, the pixel electrode PE is electrically connected to the drain DR1 of the first thin film transistor T1 of the same sub pixel SP, and the common electrode CE corresponds to the pixel electrodes PE. In this embodiment, the common electrodes CE of each of the sub pixels SP are electrically connected to each other to provide a common voltage for each of the sub pixels SP, but the present invention is not limited thereto. In addition, a plurality of scan lines SL and a plurality of data lines (not shown in the figure) are disposed on the first substrate SB1 and situated in the display region DA. The scan lines SL and the data lines are electrically connected to at least one corresponding first thin film transistor T1 of the first thin film transistors T1. For example, the scan lines SL are electrically connected to the gates G1 of the first thin film transistors T1 respectively, and the data lines are electrically connected to the sources S1 of the first thin film transistors T1 respectively, so as to transmit a signal for refreshing a display image and a signal for controlling the gray level. Moreover, in other embodiments, the sub pixels SP may include different electronic components depending on the types of the display device DP1; for example, the sub pixels SP may include light emitting components such as organic light-emitting diodes or inorganic light-emitting diodes, and the liquid crystal layer LC may be replaced by another display medium layer or be removed depending on the type of the display device DP1.

In the present invention, the first substrate SB1 has at least one driving circuit area DCA, and the driving circuit area DCA is situated in the peripheral region PA. In this embodiment, the first substrate SB1 may have two driving circuit areas DCA situated outside the two opposite sides of the display region DA, i.e. the display region DA may be situated between two driving circuit areas DCA. Note that the driving circuit areas shown in FIG. 1 and FIG. 2 is an example, and the location and number of the driving circuit area DCA are not limited thereto. For example, in a variant embodiment, the first substrate SB1 may have only one driving circuit area DCA situated outside the display region DA. The gate driving circuits DC are disposed in the driving circuit areas DCA respectively and electrically connected to the scan lines SL to output the signals to at least one corresponding scan line SL of the scan lines SL.

Figure 4:
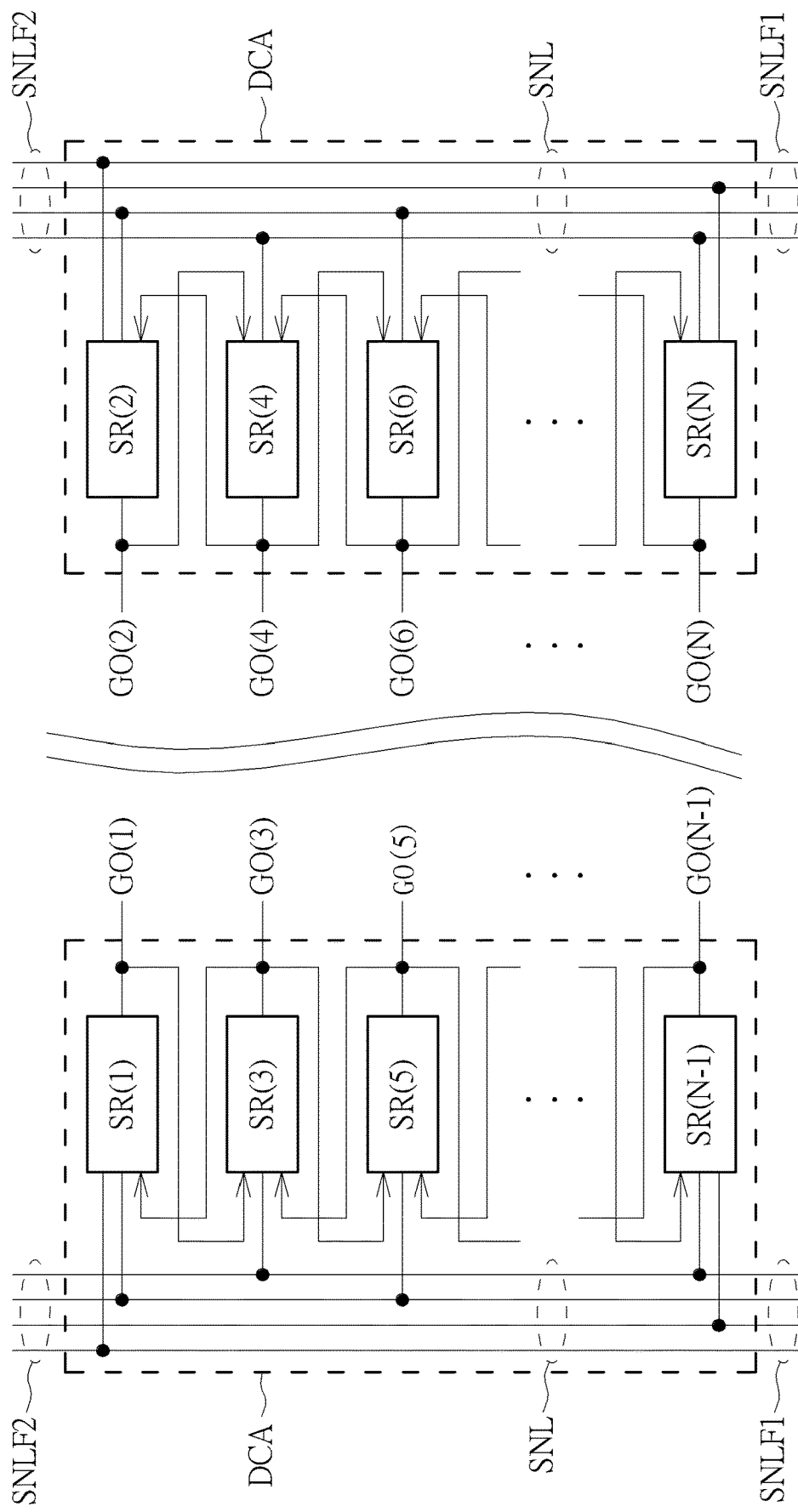
FIG. 4 is a schematic diagram showing the gate driving circuit of the present invention.

FIG. 4 is a schematic diagram showing the gate driving circuit of the present invention. In this embodiment, the gate driving circuits DC include a plurality of shift registers SR(1)~SR(N) and a plurality of signal lines SNL. The signal lines SNL provide signals to the corresponding shift registers, and the multi-stage shift registers SR(1)~SR(N) of the gate driving circuits DC generate and output scan signals GO (1)~GO (N) to the corresponding scan lines SL in the display region DA. The signal lines SNL may include at least one start signal line, at least one clock signal line and at least one end signal line, but the type and the number of the signal lines SNL are not limited thereto. In the gate driving circuit DC situated at the left hand side of the display region DA in FIG. 4, the start signal line (such as the first signal line SNL from left to right) and the end signal line (such as the second signal line SNL from left to right) are respectively electrically connected to the first stage shift registers SR(1) and the (N-1)$^{th}$ stage shift registers SR (N-1), and respectively provide a start signal and an end signal to the first stage shift registers SR(1) and the (N-1)$^{th}$ stage shift registers SR (N-1). The clock signal lines (such as the third and fourth signal lines SNL from left to right) provide clock signals to the corresponding shift registers. The way which the start signal line, the end signal line and the clock signal lines electrically connect with the shift registers of the gate driving circuit DC situated at the right hand side is similar to the gate driving circuit DC situated at the left hand side, and will therefore not be repeated. Note that the gate driving circuits shown in FIG. 4 is an example, and the gate driving circuits of the present invention are not limited thereto. As shown in FIG. 1 and FIG. 4, in this embodiment, the display device DP1 may further include a driving integrated circuit DIC, a plurality of first conductive lines SNLF1 and a plurality of the second conductive lines SNLF2. The first conductive lines SNLF1 and the second conductive lines SNLF2 are disposed outside the driving circuit area DCA and electrically connected to the corresponding signal lines SNL. The signal lines SNL are electrically connected to the driving integrated circuit DIC through the first conductive lines SNLF1, such that signals (such as start signals and/or clock signals) provided from the driving integrated circuit DIC may be transmitted to the gate driving circuit DC, so as to make the gate driving circuit DC operate and output the scan signals to the corresponding scan lines SL of the display region DA, but the present invention is not limited thereto. In a variant embodiment, the signal lines SNL are electrically connected to a control integrated circuit (not shown in the figure) through the first conductive lines SNLF1, such that signals provided from the control integrated circuit may be transmitted to the gate driving circuit DC to make the gate driving circuit DC operate. In addition, as shown on the right hand side of FIG. 3, the gate driving circuit DC may include a plurality of second thin film transistors T2 disposed on the first substrate SB1. Each of the second thin film transistors T2 includes a gate G2, a gate insulator GI2, a drain DR2, a source S2 and a semiconductor channel CN2. The gate driving circuit DC of this embodiment is a gate driver on array (GOA), wherein the shift registers of the gate driving circuit DC include the second thin film transistors T2, and the second thin film transistors T2 and the first thin film transistors T1 of the display region DA may be manufactured simultaneously by the same process. Films forming the gate G2, the gate insulator GI2, the drain DR2, the source S2 and the semiconductor channel CN2 of the second thin film transistors T2 are respectively the same as films forming the gate G1, the gate insulator GI1, the drain DR1, the source S1 and the semiconductor channel CN1 of the first thin film transistors T1. As shown on the right hand side of FIG. 3, in the driving circuit area DCA, the first passivation layer PV1 is disposed on the second thin film transistors T2. In summary, the insulating layer IL and the first passivation layer PV1 are disposed in the display region DA and the driving circuit area DCA. Moreover, in the gate driving circuit DC of this embodiment, since the drains or the sources of some of the second thin film transistors T2 need to be electrically connected to the gates of other second thin film transistors T2 to form a shift register circuit, and the drains/sources and the gates are formed of different conductive films, the second transparent conductive layer TCL2 not only includes the common electrode CE situated in the display region DA, but also includes connection lines CL situated in the driving circuit area DCA, as shown on the right hand side of FIG. 3. An end of the connection line CL is electrically connected to the drain DR2 of one of the second thin film transistors T2 by a contact hole H penetrating the first passivation layer PV1, and the other end is electrically connected to the gate (not shown in the figure) of another second thin film transistor T2 by another contact hole penetrating the insulating layer IL and the first passivation layer PV1. The connection line CL is used for bridging the drain and the gate formed of the different conductive films, but the present invention is not limited thereto. In a variant embodiment, the different conductive films are directly electrically connected to each other through a contact hole penetrating the insulating layer IL, and the second transparent conductive layer TCL2 does not have the connection lines CL.

Figure 5:
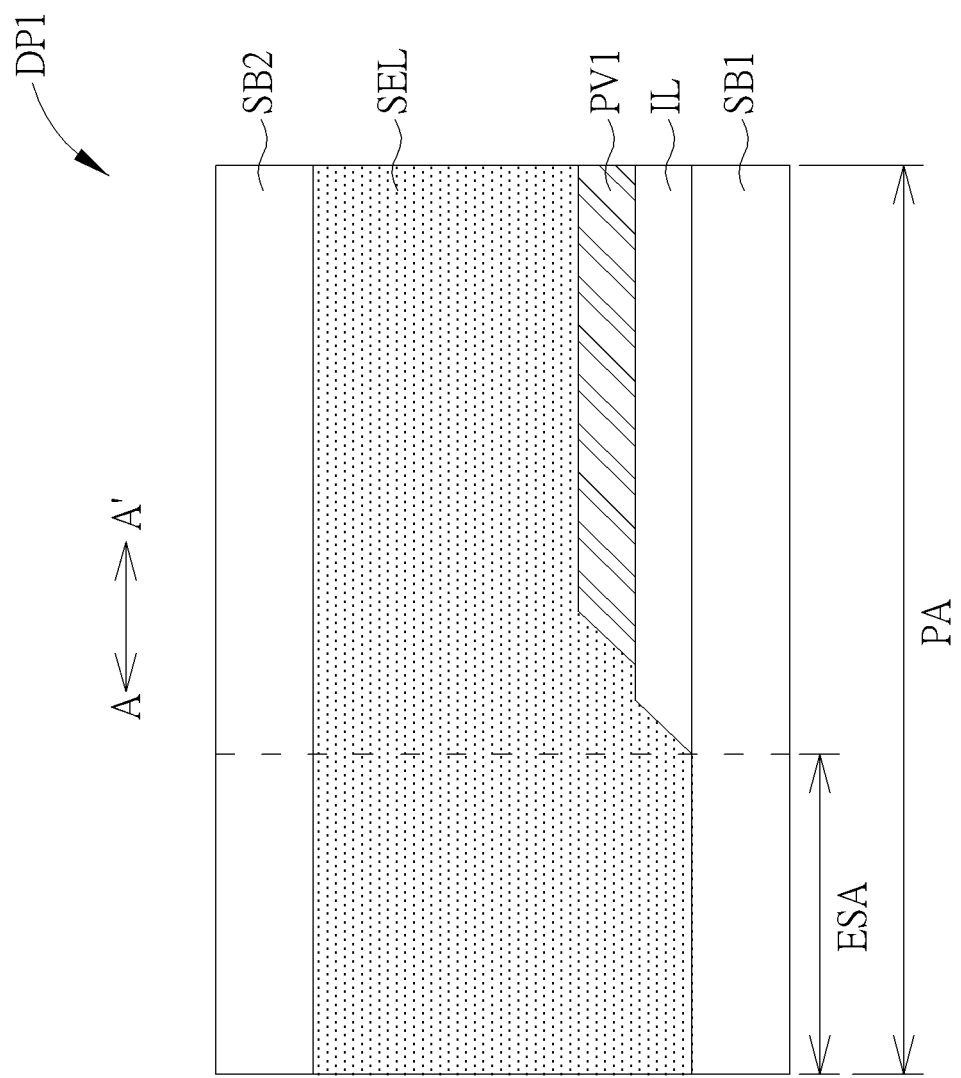
FIG. 5 is a schematic diagram taken along the line A-A' in FIG. 2.

Referring to FIG. 5, and continuing to refer to FIG. 1 to FIG. 3, FIG. 5 is a schematic diagram taken along the line A-A' in FIG. 2, wherein the left hand side of FIG. 5 shows a cross-sectional-view of the electrostatic protection area ESA. In the present invention, the first substrate SB1 has at least one electrostatic protection area ESA. The electrostatic protection area ESA is situated in the peripheral region PA and disposed along at least one edge of the first substrate SB1. In this embodiment, an edge of the electrostatic protection area ESA is aligned with the edge of the first substrate SB1, but the present invention is not limited thereto. In a variant embodiment, there is a distance between the edge of the electrostatic protection area ESA close to the edge of the first substrate SB1 and the same edge of the first substrate SB1. The driving circuit area DCA is situated between the electrostatic protection area ESA and the display region DA. In this embodiment, the first substrate SB1 has two electrostatic protection areas ESA respective disposed at opposite edges of the first substrate SB1, and the electrostatic protection areas ESA extend along a first direction D1. Therefore, each of the electrostatic protection areas ESA is disposed along one of the edges of the first substrate SB1, such that the display region DA and two driving circuit areas DCA are situated between two electrostatic protection areas ESA. The electrostatic protection areas ESA, the driving circuit areas DCA and the display region DA are arranged along a second direction D2 in FIG. 1 and FIG. 2, but the location and number of the electrostatic protection area ESA are not limited thereto. For example, the first substrate SB1 may have more than two electrostatic protection areas ESA, wherein each of the electrostatic protection areas ESA is disposed along one of the edges of the first substrate SB1. In another example, the first substrate SB1 may have only one electrostatic protection area ESA disposed along one of the edges of the first substrate SB1. As shown in FIG. 3 and FIG. 5, the insulating material disposed in the display region DA or the driving circuit area DCA is not disposed in the electrostatic protection area ESA of the first substrate SB1. The insulating layer IL and the first passivation layer PV1 do not cover and are not disposed in the electrostatic protection area ESA of the first substrate SB1. Referring to FIG. 3 as an example, in the manufacturing process of the display device DP1, after forming the gates G1, G2, the insulating layer IL covers the first substrate SB1 to form the gate insulators GI1, GI2. Then, after forming the semiconductor channels CN1, CN2, the first transparent conductive layer TCL1, the drains DR1, DR2 and the sources S1, S2, the first passivation layer PV1 covers the first substrate SB1, and then the insulating layer IL and the first passivation layer PV1 which are situated in the electrostatic protection area ESA are removed by an etch process. The second transparent conductive layer TCL2 is formed. The manufacturing method is not limited thereto. In another embodiment, the step of forming the gate insulators GI1, GI2 may involve the insulating layer IL being patterned to form the gate insulators GI1, GI2 and to remove the insulating layer IL situated in the electrostatic protection area ESA after the insulating layer IL covers the first substrate SB1.

As shown in FIG. 2 and FIG. 5, the sealant SEL of the display device DP1 is disposed between the first substrate SB1 and the second substrate SB2, wherein the sealant SEL is utilized for adhering the first substrate SB1 and the second substrate SB2 and sealing the components of the display device DP1, to prevent water vapor from penetrating into the display device DP1 and extend the life time of the display device DP1. In FIG. 2, the sealant SEL is disposed along the edges of the first substrate SB1 and the second substrate SB2, wherein and the sealant SEL covers the electrostatic protection areas ESA situated at the edges of the first substrate SB1. It should be noted that the sealant SEL has multiple portions extending along the edges of the first substrate respectively, and the widths of the portions of the sealant SEL in FIG. 2 are only illustrated for the purposes of example, and the widths of the portions of the sealant SEL may be totally equal, not totally equal or totally different. In this embodiment, at least one edge of the sealant SEL is aligned with the edge of the first substrate SB1, but the present invention is not limited thereto. In another embodiment, there is a distance between the edge of the first substrate SB1 and the edge of the sealant SEL close to this edge of the first substrate SB1, wherein the sealant SEL covers a portion of the electrostatic protection area ESA. In summary, the sealant SEL overlaps at least a portion of the electrostatic protection area ESA when viewed in a direction perpendicular to the first substrate SB1. In this embodiment, the sealant SEL may cover a portion of the driving circuit areas DCA; for example, the sealant SEL covers about half of each of the driving circuit areas DCA, wherein the width W2 of the sealant SEL may range from about 500 μm to 600 μm, but the present invention is not limited thereto. The covering area and the width of the sealant SEL may be altered. Because the insulating layer IL and the first passivation layer PV1 situated in the display region DA and the driving circuit area DCA of the thin film transistor substrate are not disposed in the electrostatic protection area ESA, before the thin film transistor substrate and a color filter substrate including the second substrate SB2 are assembled by the sealant SEL, the first substrate SB1 of the thin film transistor substrate is exposed in the electrostatic protection area ESA. No film is disposed on the first substrate SB1 in the electrostatic protection area ESA before assembling. Thus, the sealant SEL contacts the first substrate SB1 in the electrostatic protection area ESA after assembling, and the sealant SEL may cover the insulating layer IL and the first passivation layer PV1 in an area outside the electrostatic protection area ESA. Note that the bottom alignment layer of the thin film transistor substrate of this embodiment does not extend to be under the sealant SEL in FIG. 5; therefore, the sealant SEL will directly contact the first substrate SB1 in the electrostatic protection area ESA, but the present invention is not limited thereto. In a variant embodiment, the bottom alignment layer may extend to be under at least a portion of the sealant SEL, i.e. a portion of the bottom alignment layer and at least a portion of the sealant SEL overlap in the direction perpendicular to the first substrate SB1. Thus, in the variant embodiment, in the direction perpendicular to the first substrate SB1, the total area in which the sealant SEL and the electrostatic protection area ESA overlap may overlap the bottom alignment layer, such that the sealant SEL may not be in contact with the first substrate SB1 but may be in direct contact with the bottom alignment layer in the electrostatic protection area ESA. As shown in FIG. 5, after removing the insulating layer IL and the first passivation layer PV1 in the electrostatic protection area ESA, the sealant SEL is filled in the electrostatic protection area ESA, i.e. the insulating layer IL and the first passivation layer PV1 are replaced by the sealant SEL in the electrostatic protection area ESA. Furthermore, a dielectric constant of a material of the sealant SEL may be smaller than a dielectric constant of the insulating layer IL and a dielectric constant of the first passivation layer PV1. The dielectric constant of the material of the sealant SEL may therefore be smaller than a dielectric constant of the insulating material of the components of the sub pixels SP and the gate driving circuit DC.

Normally, the material with high dielectric constant or high resistance may store electrostatic charges easily or store more electrostatic charges. Therefore, when electrostatic discharge occurs, the material with high dielectric constant or high resistance will provide more electrostatic charge, such that electrostatic discharge is more serious, and the components of the sub pixels SP of the display region DA, the components of the gate driving circuit DC or other components sensitive to electrostatic charges may be influenced or damaged. For example, a threshold voltage ($V_{th}$) of the second thin film transistor T2 and/or the first thin film transistor T1 may be influenced and different from a predetermined threshold voltage, and therefore the switch function of the first thin film transistor T1 and/or second thin film transistor T2 is abnormal. In another example, wiring lines or contact holes of the display device DP1 may be damaged during the ESD event, influencing the display image or even causing the display device DP1 to break down. Furthermore, in order to achieve the narrow border of the display device DP1, the width of the peripheral region PA will be decreased, such that the sub pixels SP and the gate driving circuit DC of the display device DP1 will be close to the edge of the display device DP1. Therefore, when the electrostatic charges enter the display device DP1 from the edges of the display device DP1, the sub pixels SP and the gate driving circuit DC will be influenced or damaged easily. In addition, at the opposite sides of the display device DP1, the gate driving circuits DC are closer to the edges of the display device DP1 than the sub pixels SP, and thus, when the electrostatic discharge occurs, the gate driving circuits DC will be damaged easily. In this embodiment of the present invention, regarding the film structure in the electrostatic protection area ESA, since the insulating material (such as the insulating layer IL and the first passivation layer PV1 described above) with a high dielectric constant is replaced by the sealant SEL with a low dielectric constant, the dielectric constant of the surrounding of the display device DP1 is decreased significantly, thereby decreasing the storage of the electrostatic charges which will restrain the occurrence of electrostatic discharge or decrease the damage degree of electrostatic discharge during the ESD event. Moreover, since the electrostatic protection area ESA is disposed at the edge of the first substrate SB1 and situated at the side of the driving circuit area DCA close to the edge of the first substrate SB1, the electrostatic protection area ESA not only decreases the quantity of electrostatic charges entering the display device DP1 from the edges of the display device DP1, but also reduces the impact of electrostatic discharge on the gate driving circuit DC of the driving circuit area DCA adjacent to the electrostatic protection area ESA to thereby protect the gate driving circuit DC from being damaged during the ESD event. In addition, in order to enhance the effect of the gate driving circuit DC of the driving circuit area DCA being protected by the electrostatic protection area ESA, a width W1 of the electrostatic protection area ESA (a width W1 along the second direction D2) of this embodiment may range from about 50 μm to about 150 μm, preferably about 100 μm. A length of the electrostatic protection area ESA (a length along the first direction D1) of this embodiment may be greater than a length of the driving circuit area DCA (a length along the first direction D1). In this embodiment, a difference between the length of the electrostatic protection area ESA and the length of the driving circuit area DCA may range from about 200 μm to about 600 μm, preferably about 400 μm, i.e. the difference between the length of the electrostatic protection area ESA along a direction (such as the first direction D1) and the length of the driving circuit area DCA along this direction may range from about 200 μm to about 600 μm, preferably about 400 μm. In the first direction D1, the distance between the side of the electrostatic protection area ESA and the side of the driving circuit area DCA close thereto may range from about 100 μm to about 300 μm (distance D along the first direction D1), preferably about 200 μm. In this embodiment, a shape of the electrostatic protection area ESA shown in FIG. 1 is rectangular, but the present invention is not limited thereto. Moreover, as shown in FIG. 4, the signal lines SNL are normally disposed at a side of the gate driving circuit DC close to the electrostatic protection area ESA, the signal lines SNL extend along the first direction D1 and pass through the driving circuit area DCA, and a material of the signal lines SNL is normally metal. In order to prevent the gate driving circuit DC and the edge of the display device DP1 from being too close and causing electrostatic charges to couple to the gate driving circuit DC, thereby damaging the gate driving circuit DC, a distance between the gate driving circuit DC and the electrostatic protection area ESA may be greater than or equal to 100 μm, preferably greater than or equal to 150 μm. In this embodiment, considering the requirements of the narrow border and a width of the gate driving circuit DC in the second direction D2, the distance between the gate driving circuit DC and the electrostatic protection area ESA is greater than or equal to 100 μm and preferably less than or equal to 200 μm.

By decreasing the width of the peripheral region in order to achieve the narrow border, the adhesion and sealing will be affected because a disposition of the sealant of the convention display device is insufficient to prevent the water vapor from penetrating into the display device. Furthermore, the components of the display device will be close to the edges of the display device due to the narrow border; therefore, once water vapor invasion occurs, the components of the display device will corrode easily. For example, in the components of the gate driving circuit, the transparent conductive layer of the conductive connection structure utilized for connecting different metal layers will corrode easily. In this embodiment of the present invention, because the insulating material is replaced by the sealant SEL in the electrostatic protection area ESA, the disposition and adhesion area of the sealant SEL are increased to improve the adhesion and sealing between the thin film transistor substrate and the color filter substrate, such that the stability of the structure of display device DP1 will be increased and the water vapor invasion will be decreased, thereby the possibility of the corrosion of the components of the display device DP1 is reduced and the life time of the display device DP1 is extended.

In order to further reinforce the electrostatic discharge protection capability, the display device DP1 may include a first conductive ring CR1 and at least one first electrostatic discharge circuit ESD1. The first conductive ring CR1 surrounds the display region DA, and the first electrostatic discharge circuit ESD1 is electrically connected to the gate driving circuit DC and the first conductive ring CR1, such that the electrostatic charges which the gate driving circuit DC receives may be released to the first conductive ring CR1 through the first electrostatic discharge circuit ESD1 to prevent the electrostatic discharge current from damaging the gate driving circuit DC, thus further reinforcing the protective effect of the electrostatic discharge. In this embodiment, the first conductive ring CR1 and the first electrostatic discharge circuit ESD1 may be situated in the peripheral region PA and the first conductive ring CR1 may be situated between the display region DA and the driving circuit area DCA. The first electrostatic discharge circuit ESD1 may be disposed at a side of the driving circuit area DCA, and the first electrostatic discharge circuit ESD1 includes at least one first electrostatic protection component utilized for preventing electrostatic discharge, but the invention is not limited thereto. As shown in FIG. 1 and FIG. 4, the first electrostatic discharge circuit ESD1 is electrically connected to the first conductive lines SNLF1 and the first conductive lines SNLF1 are electrically connected to the corresponding signal lines SNL of the gate driving circuit DC. Therefore, the signal lines SNL of the gate driving circuit DC may be electrically connected to the first electrostatic discharge circuit ESD1. In this embodiment, the first electrostatic discharge circuit ESD1 may be electrically connected to one of the sides of the gate driving circuit DC through the first conductive lines SNLF1. In another embodiment, two first electrostatic discharge circuits ESD1 electrically connected to the first conductive ring CR1 may be respectively disposed at opposite sides of the driving circuit area DCA and respectively electrically connected to opposite sides of the gate driving circuit DC through the first conductive lines SNLF1 and the second conductive lines SNLF2. Further, the display device DP1 may selectively include a second conductive ring CR2 and a second electrostatic discharge circuit ESD2 disposed in the peripheral region PA. The second conductive ring CR2 surrounds the first conductive ring CR1, and the driving circuit area DCA is disposed between the first conductive ring CR1 and the second conductive ring CR2. The second electrostatic discharge circuit ESD2 is electrically connected to the gate driving circuit DC and the second conductive ring CR2, such that the electrostatic charges which the gate driving circuit DC receives may be released to the first conductive ring CR1 and the second conductive ring CR2 through the first electrostatic discharge circuit ESD1 and the second electrostatic discharge circuit ESD2, so as to further reinforce the protective effect of the electrostatic discharge about the gate driving circuit DC. In this embodiment, the first electrostatic discharge circuit ESD1 may be disposed at one of the sides of the driving circuit area DCA and electrically connected to the gate driving circuit DC through the first conductive lines SNLF1, and the first electrostatic discharge circuit ESD1 includes at least one first electrostatic protection component utilized for preventing effects of electrostatic discharge. The second electrostatic discharge circuit ESD2 may be disposed at the side opposite to the above side of the driving circuit area DCA and electrically connected to the gate driving circuit DC through the second conductive lines SNLF2, and the second electrostatic discharge circuit ESD2 includes at least one second electrostatic protection component utilized for preventing the effects of electrostatic discharge. Note that the signal lines SNL of the gate driving circuit DC are electrically connected to the first electrostatic discharge circuit ESD1 and the second electrostatic discharge circuit ESD2, i.e. the first electrostatic discharge circuit ESD1 and the second electrostatic discharge circuit ESD2 are respectively electrically connected to opposite sides of the gate driving circuit DC through the first conductive lines SNLF1 and the second conductive lines SNLF2, such that the electrostatic discharge current may be distributed through two sides of the gate driving circuit DC to bypass electrostatic charges to the first conductive ring CR1 and the second conductive ring CR2, thus enhancing ESD protection capability for the gate driving circuit DC. In addition, when the electrostatic charges are generated in at least one of the first conductive lines SNLF1 and the second conductive lines SNLF2, the electrostatic charges may be bypassed to at least one of the first and second conductive ring CR1, CR2 through at least one of the first and second electrostatic discharge unit ESD1, ESD2 before the electrostatic charges enter into the gate driving circuit DC, thus further enhancing ESD protection capability for the gate driving circuit DC. The first conductive ring CR1 and the second conductive ring CR2 of this embodiment maybe electrically connected to a common voltage, so as to release received electrostatic charges, but the present invention is not limited thereto. In a variant embodiment, the first conductive ring CR1 and the second conductive ring CR2 may be electrically connected to a predetermined voltage (e.g. ground voltage or power supply voltage). In addition, the first conductive ring CR1 and the second conductive ring CR2 of this embodiment may be formed of the existing conductive layer of the display device DP1, such as the conductive layer including the gate, the conductive layer including the source and the drain, the first transparent conductive layer TCL1 or the second transparent conductive layer TCL2. Moreover, the first conductive ring CR1 and the second conductive ring CR2 may be a closed ring or a non-closed ring. In other words, the first and second conductive ring CR1, CR2 may be both are closed rings or non-closed rings, or one and the other one of the first and second conductive ring CR1, CR2 are a closed ring and a non-closed ring respectively. For example, in some embodiments, because the second conductive ring CR2 is close to the edge of the first substrate SB1, and a plurality of bonding pins for flexible printed circuit (FPC) board are located at the bottom edge of the first substrate SB1 and are formed of at least one conductive layer of the display device DP1, the first conductive ring CR1 is a closed ring (e.g. rectangular shape closed ring) and the second conductive ring CR2 is a non-closed ring (e.g. inverted U shape non-closed ring) to prevent the second conductive ring CR2 from intersecting the bonding pins. The first electrostatic protection component and the second electrostatic protection component may include a bidirectional diode, but the present invention is not limited thereto. For example, the signal lines SNL may include multiple clock signal lines, one start signal line and one end signal line, the first electrostatic discharge circuit ESD1 includes a plurality of first electrostatic protection components, one of the ends of each first electrostatic protection component is electrically connected to the first conductive ring CR1, and another end is electrically connected to a corresponding signal line SNL of the signal lines SNL, i.e. each of the signal lines SNL is electrically connected to a corresponding first electrostatic protection component of the first electrostatic protection components, so as to bypass the electrostatic charges to the first conductive ring CR1. For example, each of the first electrostatic protection components is a bidirectional diode, and the bidirectional diode is composed of two thin film transistors such as a thin film transistor A and a thin film transistor B, wherein a control end and a first end of the thin film transistor A are electrically connected to the first conductive ring CR1, a second end of the thin film transistor A is electrically connected to one of the signal lines SNL, a control end and a first end of the thin film transistor B are electrically connected to the signal line SNL described above, and a second end of the thin film transistor B is electrically connected to the first conductive ring CR1. The second end of the thin film transistor A is electrically connected to the control end and the first end of the thin film transistor B, and the second end of the thin film transistor B is electrically connected to the control end and the first end of the thin film transistor A, so as to form the bidirectional diode. Moreover, in a variant embodiment, each of the first electrostatic protection components is composed of three thin film transistors such as a thin film transistor C, a thin film transistor D and a thin film transistor E, a control end and a first end of the thin film transistor C are electrically connected to the first conductive ring CR1, a control end and a first end of the thin film transistor D are electrically connected to one of the signal lines SNL, a first end and a second end of the thin film transistor E are respectively electrically connected to the first conductive ring CR1 and the signal line SNL described above, and a second of the thin film transistor C, a second of the thin film transistor D and a control end of the thin film transistor E are electrically connected to each other, so as to form the first electrostatic protection component. Note that although the aforementioned examples only describe the first electrostatic protection component of the first electrostatic discharge circuit ESD1, the second electrostatic protection component of the second electrostatic discharge circuit ESD2 are similar to the first electrostatic protection component, and the description will therefore not be repeated. In the aforementioned examples, the control end may be a gate, one of the first end and the second end may be a drain, and the other of the first and second end may be a source.

The display device DP1 of this embodiment may further include a third electrostatic discharge circuit ESD3 being electrically connected between the scan lines SL of the display region DA and the first conductive ring CR1, and/or electrically connected between the data lines of the display region DA and the first conductive ring CR1, so as to protect the sub pixels SP of the display region DA from being damaged by electrostatic discharge current. In this embodiment, the third electrostatic discharge circuit ESD3 is disposed in the peripheral region PA and adjacent to a corner of the display region DA, but the present invention is not limited thereto. The circuit construction and operation of the third electrostatic discharge circuit ESD3 are similar to the first electrostatic discharge circuit ESD1 and the second electrostatic discharge circuit ESD2 described above, and will therefore not be described here.

The display device of the present invention is not limited to the above embodiments. Further embodiments or modifications of the present invention are described below. For ease of comparison, same components will be labeled with the same symbol in the following. The following descriptions relate the differences between each of the embodiments, and repeated parts will not be redundantly described.

Figure 6:
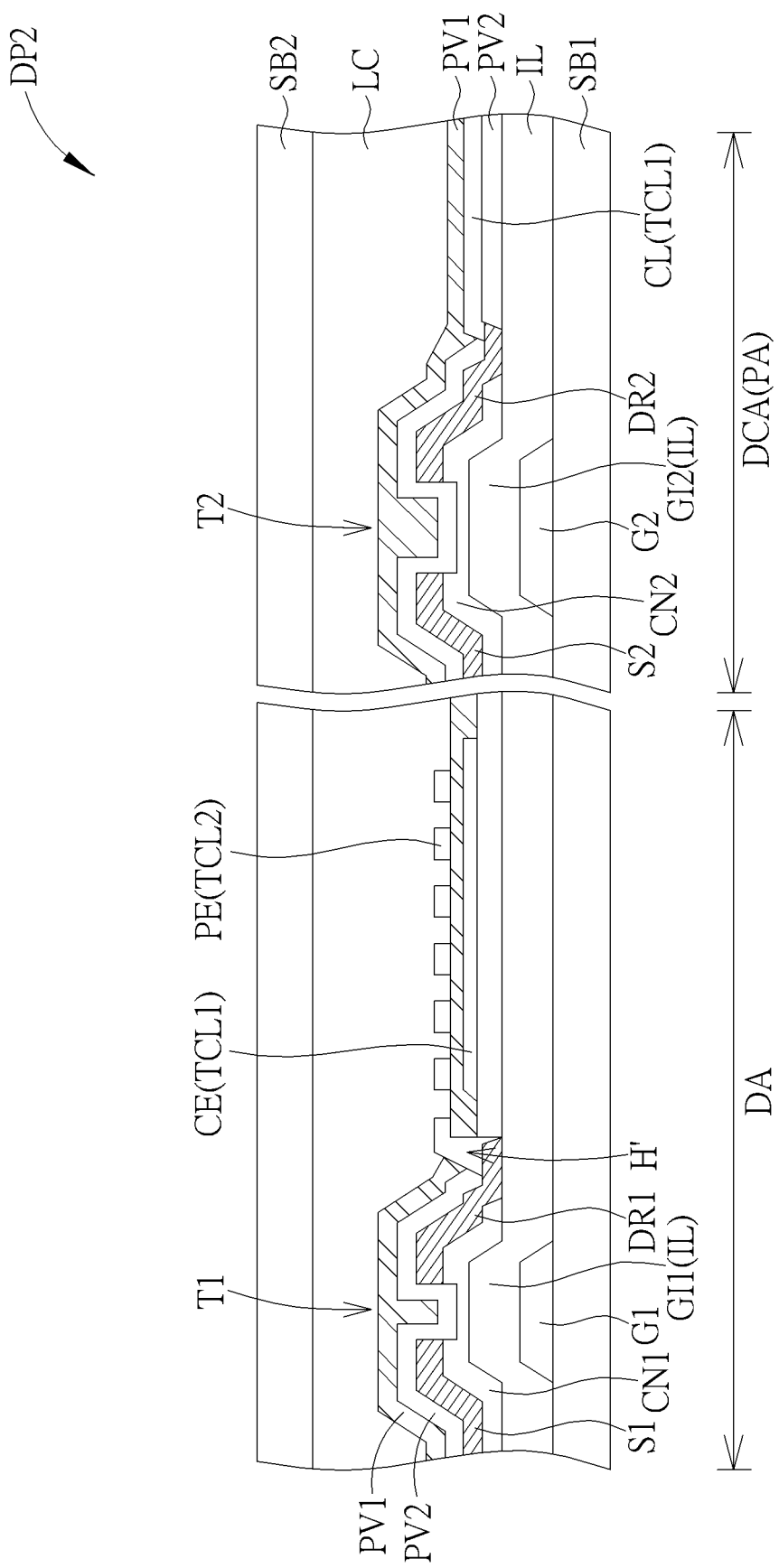
FIG. 6 is a schematic diagram showing a cross-section of a portion of a sub pixel and a portion of the gate driving circuit of a display device of a second embodiment of the present invention.
Figure 7:
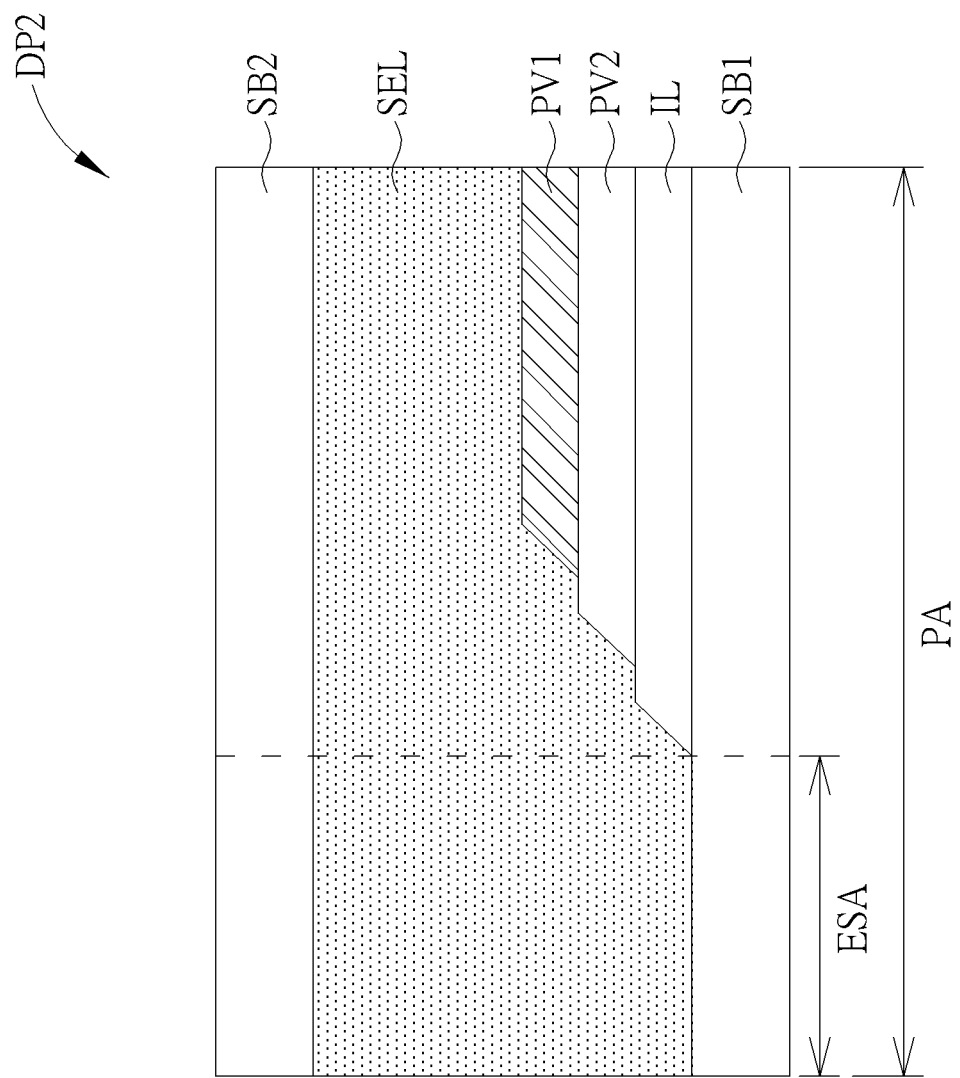
FIG. 7 is a schematic diagram showing a cross-section of a portion of the peripheral region of the display device of the second embodiment of the present invention.

FIG. 6 is a schematic diagram showing a cross-section of a portion of a sub pixel and a portion of the gate driving circuit of a display device of a second embodiment of the present invention, and FIG. 7 is a schematic diagram showing a cross-section of a portion of the peripheral region of the display device of the second embodiment of the present invention. As shown in FIG. 6, the film structure of the display device DP2 of this embodiment is different from the first embodiment. In this embodiment, the display device DP2 further includes a second passivation layer PV2 disposed between the first transparent conductive layer TCL1 and the insulating layer IL and disposed on the first thin film transistors T1 and the second thin film transistors T2. The first transparent conductive layer TCL1 of this embodiment includes at least one common electrode CE, and the second transparent conductive layer TCL2 includes a plurality of pixel electrodes PE. In this embodiment, the films respectively including the common electrode CE and the pixel electrodes PE are opposite to the first embodiment. In addition, the insulating layer IL, the first passivation layer PV1 and the second passivation layer PV2 of this embodiment may be a single-layer structure or a multi-layer structure. In this embodiment, the pixel electrode PE needs to be electrically connected to the drain DR1 of the first thin film transistor T1 through a contact hole H' penetrating through the first passivation layer PV1 and the second passivation layer PV2. In the embodiment shown in FIG. 6, the connection lines CL of the driving circuit area DCA utilized for electrically connecting between different conductive layers may be included in the first transparent conductive layer TCL1. In another embodiment, the connection lines CL may be included in the second transparent conductive layer TCL2. For example, a first metal (e.g. a metal layer including gates G1, G2) is electrically connected to a second metal (e.g. a metal layer including drains DR1, DR2 and sources S1, S2) through a connection line CL formed of the second conductive layer TCL2, the connection line CL directly contact the second metal through a contact hole penetrating the first passivation layer PV1 and the second passivation layer PV2, and the connection line CL directly contact the first metal through another contact hole penetrating the insulating layer IL, the first passivation layer PV1 and the second passivation layer PV2. In yet another embodiment, the different conductive layers may be directly electrically connected to each other by contact holes penetrating through the insulating layer IL. For example, a second metal directly contact a first metal through a contact hole penetrating through the insulating layer IL. As shown in FIG. 7, in order to decrease the dielectric constant of films disposed in the electrostatic protection area ESA and enhance the adhesion and sealing capability of the sealant SEL, the insulating material with a high dielectric constant disposed in the display region DA and the driving circuit area DCA (such as the insulating layer IL, the first passivation layer PV1 and the second passivation layer PV2) is not disposed in the electrostatic protection area ESA, and is replaced by the sealant SEL. Thus, the insulating layer IL, the first passivation layer PV1 and the second passivation layer PV2 will cover the display region DA and the driving circuit area DCA rather than cover the electrostatic protection area ESA. The dielectric constant of the sealant SEL may be smaller than the dielectric constant of the second passivation layer PV2.

In the embodiments shown in FIG. 3, FIG. 5, FIG. 6 and FIG. 7, it should be noted that the insulating layer including the gate insulator and the passivation layer of the thin film transistor substrate are not disposed in the electrostatic protection area ESA. For example, the insulating layer IL and the first passivation layer PV1 (shown in FIG. 3) are disposed in the display region DA and the driving circuit area DCA and not disposed in the electrostatic protection area ESA (shown in FIG. 5), and the insulating layer IL, the first passivation layer PV1 and the second passivation layer PV2 (shown in FIG. 6) are disposed in the display region DA and the driving circuit area DCA and not disposed in the electrostatic protection area ESA (shown in FIG. 7), but the present invention is not limited thereto. The material with a high dielectric constant stores electrostatic charges easily or stores greater electrostatic charges, and therefore, in a variant embodiment, a portion of the insulating layer forming the gate insulator and the passivation layer of the thin film transistor substrate (such as the insulating material with a dielectric constant higher than the sealant SEL) is removed and not disposed in the electrostatic protection area ESA, and the remainder of the insulating material is disposed in the electrostatic protection area ESA. For example, the dielectric constant of the sealant SEL normally ranges from 3 to 4 (e.g. 3.6), the insulating layer and/or the passivation layer may include silicon nitride ($SiN_x$), the dielectric constant of the silicon nitride normally ranges from 6 to 8 (e.g. 7); therefore, at least a portion of the insulating material (such as the silicon nitride) included in the insulating layer and the passivation layer of the thin film transistor substrate and having the dielectric constant higher than the sealant SEL may be removed in the electrostatic protection area ESA, and the sealant SEL can be filled in to replace the insulating material removed, such that the dielectric constant of the surrounding of the display device is decreased to reduce storage of electrostatic charge. In summary, in the insulating layer including the gate insulator and at least one passivation layer disposed in the display region DA and the driving circuit area DCA of the thin film transistor substrate, at least one of the passivation layer and insulating layer is not disposed in the electrostatic protection area ESA and includes an insulating material with a dielectric constant greater than the dielectric constant of the sealant SEL, so as to decrease storage of electrostatic charge. Preferably, the insulating layer and passivation layer are not disposed in the electrostatic protection area ESA to further decrease storage of electrostatic charge and to further increase the disposition and adhesion area of the sealant SEL, such that the electrostatic discharge damage may be avoided, and the adhesion and sealing capability between the thin film transistor substrate and the color filter substrate may be improved.

Figure 8:
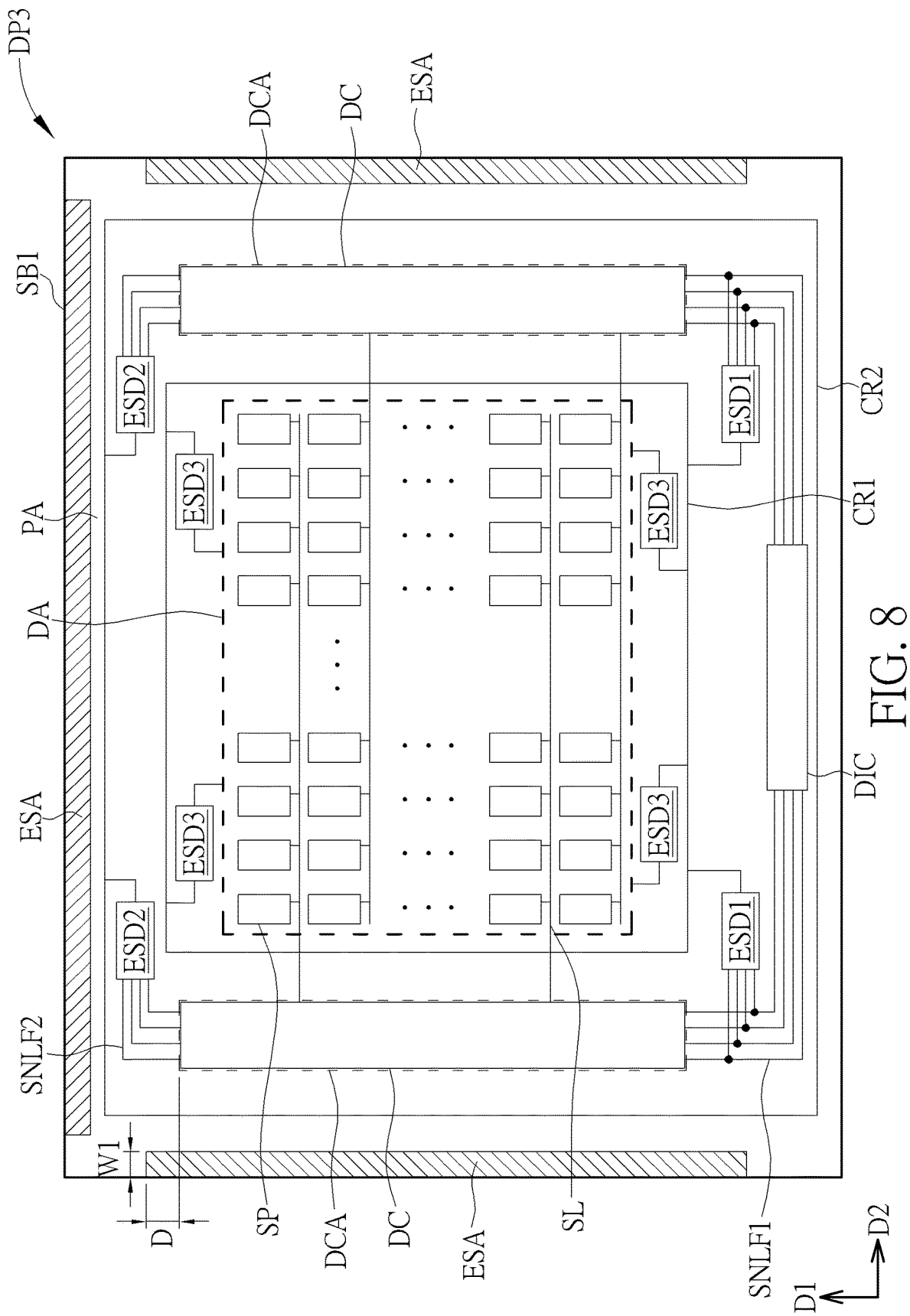
FIG. 8 is a schematic diagram showing a top view of a display device of a third embodiment of the present invention.

FIG. 8 is a schematic diagram showing a top view of a display device of a third embodiment of the present invention, wherein FIG. 8 omits the second substrate and the sealant to simplify the figure, and the dispositions of the second substrate and the sealant may be known by referring to FIG. 2. As shown in FIG. 8, compared to the first embodiment having two electrostatic protection areas ESA disposed at two edges of the first substrate SB1 respectively, the first substrate SB1 of the display device DP3 of this embodiment has three electrostatic protection areas ESA, each of the electrostatic protection areas ESA being disposed at one of the edges of the first substrate SB1, such that the electrostatic discharge protection may be further enhanced. Two of the electrostatic protection areas ESA are the same as in the first embodiment, and will not be described here; the other electrostatic protection area ESA extends along the second direction D2.

Figure 9:
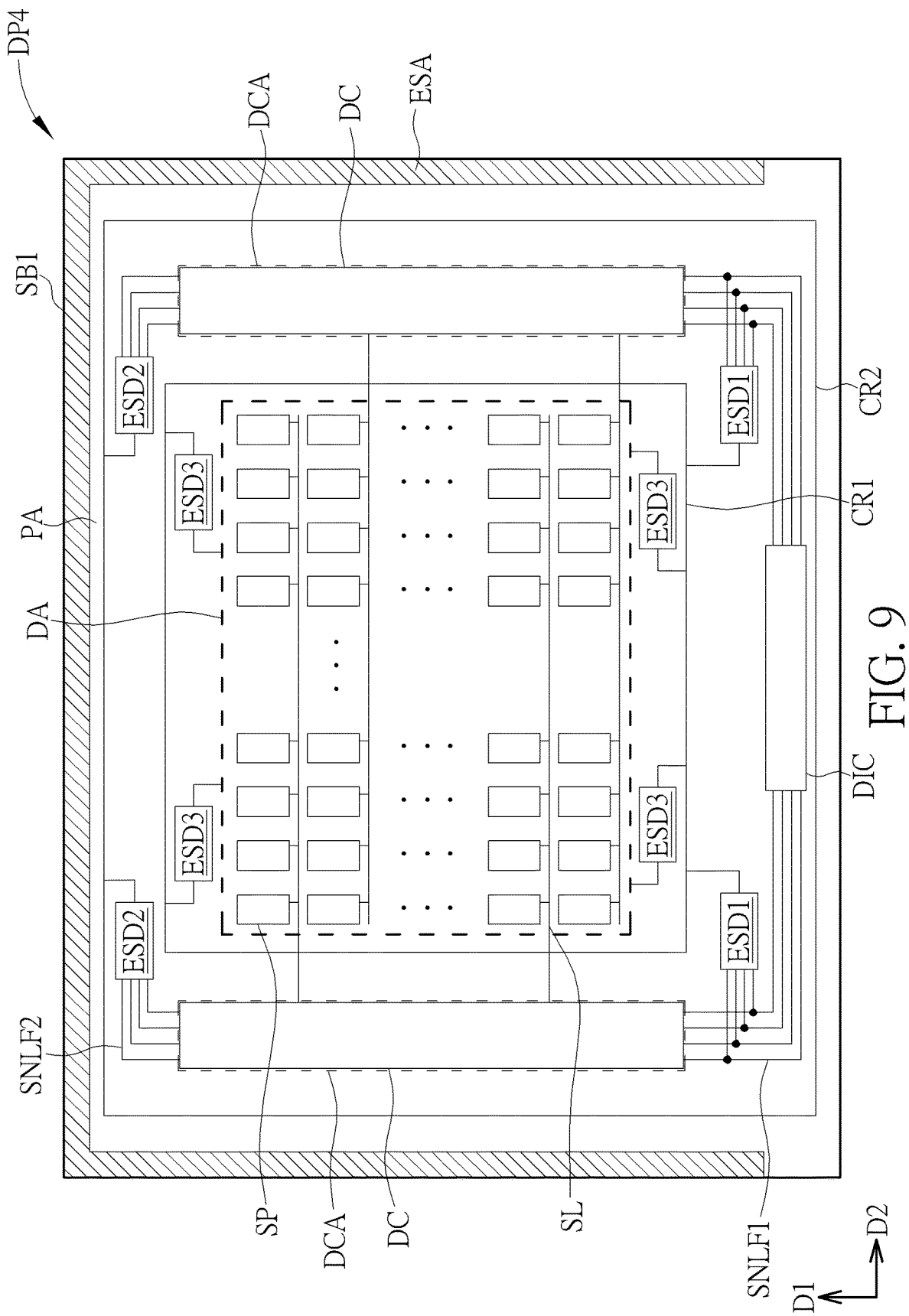
FIG. 9 is a schematic diagram showing a top view of a display device of a fourth embodiment of the present invention.

FIG. 9 is a schematic diagram showing a top view of a display device of a fourth embodiment of the present invention, wherein FIG. 9 omits the second substrate and the sealant to simplify the figure, and the dispositions of the second substrate and the sealant may be known by referring to FIG. 2. As shown in FIG. 9, compared to the first embodiment having no electrostatic protection area ESA at the top edge of the first substrate SB1 and the third embodiment having no electrostatic protection area ESA at the upper right corner and the upper left corner of the first substrate SB1, the first substrate SB1 of the display device DP4 of this embodiment only has one electrostatic protection area ESA, and the electrostatic protection area ESA is disposed at a plurality of edges of the first substrate SB1 and extends continuously along the edges of the first substrate SB1, thereby further enhancing the electrostatic discharge protection. In this embodiment, the electrostatic protection area ESA is disposed at three of the edges of the first substrate SB1 to form an inverted "U" shape, but the invention is not limited thereto. In another embodiment, the first substrate SB1 may have a plurality of electrostatic protection areas ESA, and each of the electrostatic protection areas ESA may be disposed at one of the edges or a plurality of the edges depending on design requirements. Note that the edges of the electrostatic protection area ESA of this embodiment may be aligned to three of the edges of the second substrate SB2, so as to make three edges of the display device DP4 to align with the electrostatic protection ESA, and the electrostatic discharge protection capability of the display device DP4 is further enhanced.

Figure 10:
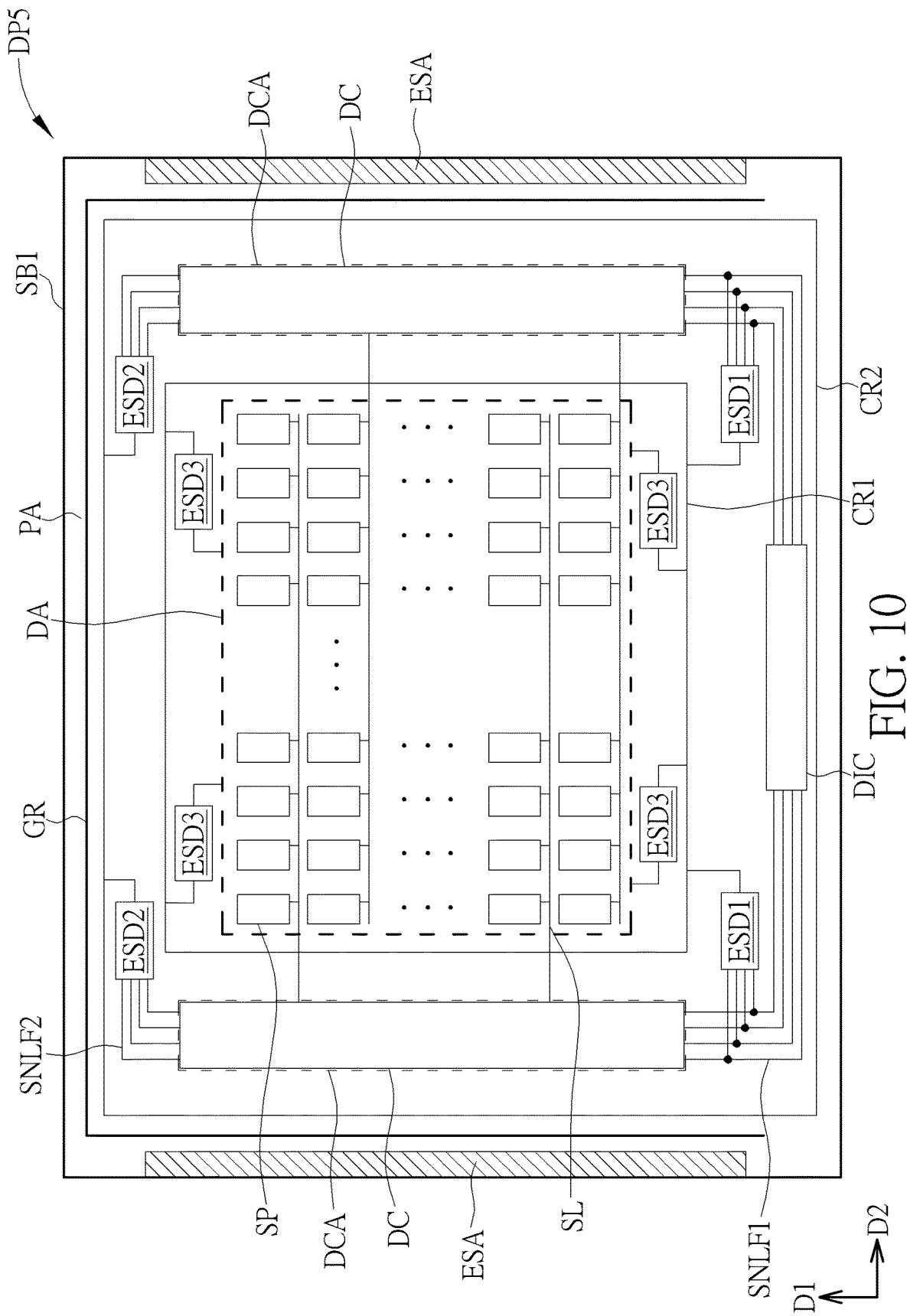
FIG. 10 is a schematic diagram showing a top view of a display device of a fifth embodiment of the present invention.

FIG. 10 is a schematic diagram showing a top view of a display device of a fifth embodiment of the present invention, wherein FIG. 10 omits the second substrate and the sealant to simplify the figure, and the dispositions of the second substrate and the sealant may be known by referring to FIG. 2. As shown in FIG. 10, compared to the first embodiment, the display device DP5 of this embodiment further includes a grounding line GR disposed between the electrostatic protection area ESA and the gate driving circuit DC, to provide the display device DP5 with a shielding effect about the electrostatic charges to thereby enhance the electrostatic discharge protection capability. For example, the grounding line GR of this embodiment may be disposed at three of the edges of the first substrate SB1, and may be formed of one of the conductive layers of the display device DP5. In this embodiment, since the grounding line GR is disposed between the electrostatic protection area ESA and the gate driving circuit DC, in the top-view of the first substrate SB1, the grounding line GR is a conductor closest to the edges of the first substrate SB1. Moreover, the sealant SEL of this embodiment overlaps the grounding line GR in the direction perpendicular to the first substrate SB1. Therefore, when the electrostatic charges enter the display device from an external environment, because the grounding line GR is the conductor closest to the edges of the first substrate SB1 and overlaps the sealant SEL in the direction perpendicular to the first substrate SB1, the electrostatic charges will be released through the grounding line GR, so as not to damage the components of the display device (such as the gate driving circuit DC and/or the sub pixels SP). Since the grounding line GR and the sealant SEL overlap in the direction perpendicular to the first substrate SB1, when the distance between the grounding line GR and the sealant SEL in the direction perpendicular to the first substrate SB1 is smaller, the electrostatic charges are easier to be bypassed through the grounding line GR. Thus, the grounding line GR is preferably formed of one of the conductive layers disposed between the liquid crystal layer LC and the first substrate SB1 that is closest to the liquid crystal layer LC when viewed in a cross-section of the display device DP5 taken in a direction perpendicular to the first substrate SB1. In other words, the grounding line GR is preferably formed of the uppermost conductive layer of the thin film transistor substrate, but the present invention is not limited thereto. The conductive layer in which the grounding line GR is formed may be a transparent conductive layer or a metal layer, but the present invention is not limited thereto. In this embodiment, the display device is a transverse electrical field display device, which is two transparent conductive layers disposed between the first substrate SB1 and the liquid crystal layer LC that respectively form the pixel electrode PE and the common electrode CE to drive liquid crystal molecules of the liquid crystal layer LC. Therefore, the second transparent conductive layer TCL2 is one of the conductive layers disposed between the liquid crystal layer LC and the first substrate SB1 that is closest to the liquid crystal layer LC in the direction perpendicular to the first substrate SB1, so the grounding line GR is preferably formed of the second transparent conductive layer TCL2. In another embodiment, the pixel electrode formed of a transparent conductive layer and the common electrode formed of another transparent conductive layer are respectively disposed on the first substrate SB1 and the second substrate SB2 (e.g. TN type display device or VA type display device), and the grounding line GR is formed of the transparent conductive layer including the pixel electrode. In yet another embodiment, no transparent conductive layer is disposed between the first substrate SB1 and the liquid crystal layer LC, and the grounding line GR may be formed of one of the metal layers disposed between the liquid crystal layer LC and the first substrate SB1 that is closest to the liquid crystal layer LC in the direction perpendicular to the first substrate SB1. Note that the grounding line GR may be a single layer structure or a multi-layer structure, and the multi-layer structure includes one of the conductive layers disposed between the liquid crystal layer LC and the first substrate SB1 that is closest to the liquid crystal layer LC in the direction perpendicular to the first substrate SB1. In addition, although the way of grounding the grounding line GR is not shown in FIG. 10, in an embodiment, at least one end of the grounding line GR may be electrically connected to at least one grounding pad of the driving integrated circuit DIC. In another embodiment, at least one end of the grounding line GR may be electrically connected to a bonding pad of the first substrate SB1, and a control circuit board or a control chip provides a grounding voltage for the grounding line by being electrically connected to the bonding pad. In still another embodiment, the second substrate SB2 of the display device DP5 has a shielding grounding layer, and at least one end of the grounding line GR may be grounded by being electrically connected to the shielding grounding layer through a conductor (such as a conductive paste), but the way of grounding the grounding line GR is not limited thereto.

In summary, in the film structure in the electrostatic protection area of the display device of the present invention, since the sealant replaces the insulating material with a high dielectric constant included in the electronic components in the display region or the peripheral region, the dielectric constant of the surrounding of the display device is decreased to reduce the storage of electrostatic charges, so as to restrain the occurrence of electrostatic discharge or decrease the damaging influence damage to the display device caused by electrostatic discharge. Furthermore, because the electrostatic protection area is disposed at the edge of the first substrate and situated at the side of the driving circuit area adjacent to the edge of the first substrate, the electrostatic protection area not only can decrease the storage of electrostatic charges entering from the edges of the display device, but can also decrease the influence caused by the electrostatic charges on the gate driving circuit of the driving circuit area adjacent to the electrostatic protection area to protect the gate driving circuit. Therefore, the reliability of the display device with narrow border is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A thin film transistor substrate, having a display region and a peripheral region, the thin film transistor substrate comprising:
   a first substrate having at least one electrostatic protection area and at least one driving circuit area, the electrostatic protection area and the driving circuit area being disposed in the peripheral region, and the driving circuit area being disposed between the electrostatic protection area and the display region;
   a plurality of scan lines and a plurality of data lines disposed on the first substrate and situated in the display region;
   a plurality of first thin film transistors disposed on the first substrate and situated in the display region, each of the first thin film transistors comprising a gate, a drain, a source, a gate insulator and a semiconductor channel, the gate insulator disposed between the gate and the semiconductor channel, and the gate and the source being respectively electrically connected to a corresponding scan line of the scan lines and a corresponding data line of the data lines;
   an insulating layer disposed on the first substrate, wherein the insulating layer includes the gate insulators of the first thin film transistors;
   at least one passivation layer disposed on the insulating layer; and
   at least one gate driving circuit disposed in the driving circuit area of the first substrate, the at least one gate driving circuit being electrically connected to the scan lines;

wherein at least one of the at least one passivation layer and the insulating layer is not disposed in the electrostatic protection area.

2. The thin film transistor substrate of claim 1, wherein the at least one passivation layer and the insulating layer are not disposed in the electrostatic protection area.

3. The thin film transistor substrate of claim 2, wherein the first substrate is exposed in the electrostatic protection area.

4. The thin film transistor substrate of claim 1, wherein an edge of the electrostatic protection area is aligned to an edge of the first substrate.

5. The thin film transistor substrate of claim 1, wherein the gate driving circuit comprises a plurality of second thin film transistors disposed on the first substrate and situated in the driving circuit area, wherein the at least one passivation layer is disposed on the second thin film transistors.

6. The thin film transistor substrate of claim 1, wherein the at least one passivation layer comprises a first passivation layer, and the thin film transistor substrate further comprises:
a first transparent conductive layer disposed between the insulating layer and the first passivation layer; and
a second transparent conductive layer disposed on the first passivation layer.

7. The thin film transistor substrate of claim 6, wherein the first transparent conductive layer comprises a plurality of pixel electrodes, each of the pixel electrodes is electrically connected to the drain of a corresponding first thin film transistor of the first thin film transistors, and the second transparent conductive layer comprises at least one common electrode.

8. The thin film transistor substrate of claim 6, wherein the at least one passivation layer further comprises a second passivation layer disposed between the first transparent conductive layer and the insulating layer.

9. The thin film transistor substrate of claim 8, wherein the first transparent conductive layer comprises at least one common electrode, the second transparent conductive layer comprises a plurality of pixel electrodes, and each of the pixel electrodes is electrically connected to the drain of a corresponding first thin film transistor of the first thin film transistors.

10. The thin film transistor substrate of claim 1, wherein the thin film transistor substrate comprises a plurality of electrostatic protection areas, and each of the electrostatic protection areas is disposed along one edge of the first substrate respectively.

11. The thin film transistor substrate of claim 1, wherein a length of the electrostatic protection area along a direction is greater than a length of the driving circuit area along the direction.

12. The thin film transistor substrate of claim 1, further comprising a first conductive ring and a first electrostatic discharge circuit disposed in the peripheral region, wherein the first conductive ring surrounds the display region, and the first electrostatic discharge circuit is electrically connected to the gate driving circuit and the first conductive ring.

13. The thin film transistor substrate of claim 12, further comprising a second conductive ring and a second electrostatic discharge circuit disposed in the peripheral region, wherein the second conductive ring surrounds the first conductive ring, the driving circuit area is situated between the first conductive ring and the second conductive ring, and the second electrostatic discharge circuit is electrically connected to the gate driving circuit and the second conductive ring.

14. The thin film transistor substrate of claim 12, wherein a voltage of the first conductive ring is a common voltage.

15. The thin film transistor substrate of claim 1, further comprising a grounding line disposed between the electrostatic protection area and the gate driving circuit.

16. The thin film transistor substrate of claim 1, wherein a distance between the electrostatic protection area and the driving circuit area ranges from about 100 μm to about 200 μm.

17. The thin film transistor substrate of claim 1, wherein a width of the electrostatic protection area ranges from about 50 μm to about 150 μm, and a difference between a length of the electrostatic protection area along a direction and a length of the driving circuit area along the direction ranges from about 200 μm to about 600 μm.

18. A display device, comprising:
a thin film transistor substrate having a display region and a peripheral region, the thin film transistor substrate comprising:
a first substrate having at least one electrostatic protection area and at least one driving circuit area, the electrostatic protection area and the driving circuit area being disposed in the peripheral region, and the driving circuit area being disposed between the electrostatic protection area and the display region;
a plurality of scan lines and a plurality of data lines disposed on the first substrate and situated in the display region;
a plurality of first thin film transistors disposed on the first substrate and situated in the display region, each of the first thin film transistors comprising a gate, a drain, a source, a gate insulator and a semiconductor channel, the gate insulator disposed between the gate and the semiconductor channel, and the gate and the source being respectively electrically connected to a corresponding scan line of the scan lines and a corresponding data line of the data lines;
an insulating layer disposed on the first substrate, wherein the insulating layer includes the gate insulators of the first thin film transistors;
at least one passivation layer disposed on the insulating layer; and
at least one gate driving circuit disposed in the driving circuit area of the first substrate, the at least one gate driving circuit being electrically connected to the scan lines,
wherein at least one of the at least one passivation layer and the insulating layer is not disposed in the electrostatic protection area;
a second substrate disposed opposite to the thin film transistor substrate; and
a sealant disposed between the thin film transistor substrate and the second substrate, the sealant overlapping at least a portion of the electrostatic protection area in a direction perpendicular to the first substrate.

19. The display device of claim 18, wherein the sealant is in contact with the first substrate in the electrostatic protection area.

20. The display device of claim 18, wherein the at least one of the at least one passivation layer and the insulating layer not disposed in the electrostatic protection area comprises an insulating material with a dielectric constant greater than a dielectric constant of the sealant.

* * * * *